(12) United States Patent
Ovshinsky

(10) Patent No.: US 8,017,198 B2
(45) Date of Patent: Sep. 13, 2011

(54) THIN FILM DEPOSITION VIA CHARGED PARTICLE-DEPLETED PLASMA ACHIEVED BY MAGNETIC CONFINEMENT

(75) Inventor: Stanford R. Ovshinsky, Bloomfield Hills, MI (US)

(73) Assignee: Ovshinsky Innovation LLC, Bloomfield Hills, MI (US)

( * ) Notice: Subject to any disclaimer, the term of this patent is extended or adjusted under 35 U.S.C. 154(b) by 116 days.

(21) Appl. No.: 12/429,637

(22) Filed: Apr. 24, 2009

(65) Prior Publication Data

US 2010/0273315 A1    Oct. 28, 2010

(51) Int. Cl.
*H05H 1/02* (2006.01)
(52) U.S. Cl. .................................................. 427/571
(58) Field of Classification Search .............. 427/569, 427/571, 452; 118/715
See application file for complete search history.

(56) References Cited

U.S. PATENT DOCUMENTS

| | | | | |
|---|---|---|---|---|
| 4,226,898 A | * | 10/1980 | Ovshinsky et al. | 438/483 |
| 5,032,193 A | * | 7/1991 | Ovshinsky et al. | 148/242 |
| 5,192,717 A | * | 3/1993 | Kawakami et al. | 438/479 |
| 5,324,553 A | * | 6/1994 | Ovshinsky et al. | 427/571 |
| 5,336,533 A | * | 8/1994 | Balmashnov et al. | 427/562 |
| 2008/0090022 A1 | * | 4/2008 | Ovshinsky | 427/569 |

* cited by examiner

*Primary Examiner* — Timothy Meeks
*Assistant Examiner* — Elizabeth Burkhart
(74) *Attorney, Agent, or Firm* — Kevin L. Bray

(57) ABSTRACT

A method and apparatus for forming thin film materials via a plasma deposition process in the presence of a magnetic field. A precursor is delivered to a deposition chamber and activated to form a plasma. The plasma may be initiated in the presence of a magnetic field or subjected to a magnetic field after initiation. The plasma includes ionized and neutral species derived from the precursor and the magnetic field manipulates the plasma to effect a reduction in the population of ionized species and an enhancement of the population of neutral species. A thin film material is subsequently formed from the resulting neutral-enriched deposition medium. The method permits formation of thin film materials having a low density of defects. In one embodiment, the thin film material is a photovoltaic material and the suppression of defects leads to an enhancement in photovoltaic efficiency.

43 Claims, 5 Drawing Sheets

○ = neutral species
+ = positive species
− = negative species

THIN FILM DEPOSITION VIA CHARGED PARTICLE-DEPLETED PLASMA ACHIEVED BY MAGNETIC CONFINEMENT

FIELD OF INVENTION

This invention relates to the deposition of thin film materials using an intermediate plasma. More particularly, this invention relates to deposition of thin films using an intermediate magnetically-controlled plasma. Most particularly, this invention relates to deposition of photovoltaic materials from a charged particle-depleted deposition medium obtained through magnetic manipulation of a plasma.

BACKGROUND OF THE INVENTION

Concern over the depletion and environmental impact of fossil fuels has stimulated strong interest in the development of alternative energy sources. Significant investments in areas such as batteries, fuel cells, hydrogen production and storage, biomass, wind power, algae, and solar energy have been made as society seeks to develop new ways of creating and storing energy in an economically competitive and environmentally benign fashion. The ultimate objective is to minimize society's reliance on fossil fuels and to do so in an economically competitive way that minimizes greenhouse gas production.

A number of experts have concluded that to avoid the serious consequences of global warming, it is necessary to maintain $CO_2$ at levels of 550 ppm or less. To meet this target, based on current projections of world energy usage, the world will need 17 TW of carbon-free energy by the year 2050 and 33 TW by the year 2100. The estimated contribution of various carbon-free sources toward the year 2050 goal are summarized below:

| Source | Projected Energy Supply (TW) |
|---|---|
| Wind | 2-4 |
| Tidal | 2 |
| Hydro | 1.6 |
| Biofuels | 5-7 |
| Geothermal | 2-4 |
| Solar | 600 |

Based on the expected supply of energy from the available carbon-free sources, many experts believe that solar energy is the most viable solution for reducing greenhouse emissions and alleviating the effects of global climate change.

Unless solar energy becomes cost competitive with fossil fuels, however, society will lack the motivation to eliminate its dependence on fossil fuels and will refrain from adopting solar energy on the scale necessary to meaningfully address global warming. As a result, current efforts in manufacturing are directed at reducing the unit cost (cost per kilowatt-hour) of energy produced by photovoltaic materials and products.

The general strategies for decreasing the unit cost of energy from photovoltaic products are (1) reducing process costs and (2) improving photovoltaic efficiency. Efforts at reducing process costs are directed to identifying low cost photovoltaic materials and increasing process speeds. Crystalline silicon is currently the dominant photovoltaic material because of its wide availability in bulk form. Crystalline silicon, however, possesses weak absorption of solar energy because it is an indirect gap material. As a result, photovoltaic modules made from crystalline silicon are thick, rigid and not amenable to lightweight, thin film products.

Materials with stronger absorption of the solar spectrum are under active development for photovoltaic products. Representative materials include CdS, CdSe, CdTe, ZnTe, CIGS (Cu—In—Ga—Se and related alloys), organic materials (including organic dyes), and $TiO_2$. These materials offer the prospect of reduced material costs because their high solar absorption efficiency permits photovoltaic operation with thin films, thus reducing the volume of material needed to manufacture devices.

Amorphous silicon (and hydrogenated or fluorinated forms thereof) is another attractive photovoltaic material for lightweight, efficient, and flexible thin-film photovoltaic products. Stanford R. Ovshinsky was among the first to recognize the advantages of amorphous silicon (as well as amorphous germanium, amorphous alloys of silicon and germanium, including doped, hydrogenated and fluorinated versions thereof) as a photovoltaic material. S. R. Ovshinsky also recognized the underlying physical properties and practical benefits of the nanocrystalline, microcrystalline, and intermediate range order forms of silicon, germanium, silicon-germanium alloys and related materials. For representative contributions of S. R. Ovshinsky in the area of silicon-based photovoltaic materials see U.S. Pat. Nos. 4,217,374 (describing suitability of amorphous silicon and related materials as the active material in several semiconducting devices); 4,226,898 (demonstration of solar cells having multiple layers, including n- and p-doped); and 5,103,284 (deposition of nanocrystalline silicon and demonstration of advantages thereof); as well as his article entitled "The material basis of efficiency and stability in amorphous photovoltaics" (Solar Energy Materials and Solar Cells, vol. 32, p. 443-449 (1994)).

Approaches for increasing process speed and throughput include: (1) increasing the intrinsic deposition rates of the different materials and layers used to manufacture photovoltaic devices and (2) adopting a continuous, instead of a batch, manufacturing process. S. R. Ovshinsky has pioneered the automated and continuous manufacturing techniques needed to produce thin film, flexible large-area solar panels based on amorphous, nanocrystalline, microcrystalline, polycrystalline or composite materials. Although his work has emphasized the silicon and germanium systems, the manufacturing techniques that he has developed are universal to all material systems. Representative contributions of S. R. Ovshinsky to the field of high speed thin film manufacturing are included in U.S. Pat. Nos. 4,400,409 (describing a continuous manufacturing process for making thin film photovoltaic films and devices); 4,410,588 (describing an apparatus for the continuous manufacturing of thin film photovoltaic solar cells); 4,438,723 (describing an apparatus having multiple deposition chambers for the continuous manufacturing of multilayer photovoltaic devices); and 5,324,553 (microwave deposition of thin film photovoltaic materials).

A second general approach for decreasing the unit cost of energy from photovoltaic products is to improve photovoltaic efficiency. Photovoltaic efficiency depends on maximizing the generation of photoexcited charge carriers from a given amount of incident light and harvesting as many of the photoexcited charge carrier as possible. Both the intrinsic properties of the active photovoltaic material and the characteristics of the surrounding layers in the device structure are important for optimizing photovoltaic efficiency. As noted above, the absorption efficiency of the active photovoltaic material is critical in maximizing the number of photogenerated charge carriers. Once generated, however, the charge carriers must be able to migrate to the external contacts of the photovoltaic device to provide power to an external load. To maximize performance, it is necessary to recover the highest possible fraction of photogenerated carriers and to minimize losses in energy associated with transporting photogenerated carriers to the outer contacts. It is especially important that transport of charge carriers occurs without recombination in order to insure high photovoltaic efficiency. The presence of defects in a photovoltaic material degrades photovoltaic efficiency by providing sites for recombination of photogenerated charge carriers.

One problem with current plasma-deposited photovoltaic materials is the presence of a high concentration of intrinsic defects in the as-deposited state. The intrinsic defects include structural defects (e.g. dangling bonds, strained bonds, unpassivated surface states, non-tetrahedral bonding distortions, coordinatively unsaturated silicon or germanium) that create electronic states within the bandgap of the photovoltaic material. The midgap states detract from solar conversion efficiency by acting as nonradiative recombination centers that deplete the concentration of free carriers generated by absorbed sunlight. Instead of being available for external current, the energy of many of the photoexcited free carriers is dissipated thermally through nonradiative decay. The external current delivered by a photovoltaic material is reduced accordingly.

It has been observed that the concentration of intrinsic defects increases as the deposition rate of amorphous silicon-based photovoltaic increases. In order to improve photovoltaic efficiency, it has been necessary in the prior art to reduce the speed of plasma deposition. It is believed that reduced deposition rates suppress the formation of defects in the as-deposited material or provide sufficient time to allow as-formed defects to equilibrate to a more regular bonding configuration.

A need exists in the art for a method for preparing thin film photovoltaic materials (including amorphous, nanocrystalline, microcrystalline, and polycrystalline forms of silicon, germanium, and alloys of either) at high deposition rates without sacrificing photovoltaic efficiency due to recombination processes associated with intrinsic defects. The low deposition rates needed to achieve high photovoltaic efficiency limit the economic competiveness of conventional plasma deposition processes. It is desirable to develop new deposition processes that produce photovoltaic materials, especially silicon-containing materials of any crystalline or non-crystalline form, at high deposition rates without compromising quality.

SUMMARY OF THE INVENTION

The instant invention provides a method and apparatus for the plasma deposition of thin film materials. In one embodiment, the invention is directed at the plasma deposition of photovoltaic materials at high deposition rates with improved photovoltaic efficiency. The invention recognizes that the plasmas used in prior art deposition processes are unrefined and include ionized species that are detrimental to photovoltaic efficiency. In the invention, a plasma formed from one or more precursors is manipulated with a magnetic field to provide a deposition medium more conducive to the formation of thin film or photovoltaic materials having a low defect concentration in the as-deposited state.

In the instant invention, a plasma is formed from one or more deposition precursors and its composition is controlled to provide a deposition medium having an optimized distribution of growth species adjacent to the deposition surface. The characteristics of the plasma are controlled by a magnetic field that is configured to reduce the concentration of ionized species and increase the concentration of neutral species. Neutral species include charge-neutral molecules and charge-neutral free radicals. In one embodiment, the magnetic field increases the concentration of neutral species in the plasma relative to ionized species. In another embodiment, the magnetic field increases the concentration of excited state neutral species in the plasma relative to ionized species. Enrichment of the plasma with neutral species promotes the formation of as-deposited thin film materials by reducing the presence of ionized species and avoiding deleterious interactions between ionized species and the thin film material.

In one embodiment, the method includes delivery of one or more deposition precursors to a plasma source chamber equipped to form a plasma therefrom, manipulation of the resulting plasma with a magnetic field to form a deposition medium enriched with neutral species or excited state neutral species, ejection of the enriched deposition medium from the plasma source chamber, and deposition of a thin film material from the ejected enriched deposition medium on a substrate located external to the plasma source chamber. The neutral-enriched deposition medium may also be viewed as a charged particle-depleted deposition medium. The plasma source chamber may also include one or more background gases that may participate in the plasma formation process and/or accompany the charged particle-depleted deposition medium as it exits the plasma source chamber.

In another embodiment, magnetic manipulation of the plasma occurs in the vicinity of the substrate. In this embodiment, a substrate is positioned within a deposition apparatus equipped to form a plasma. The apparatus includes a cathode and anode for forming plasma. The deposition apparatus includes one or more injection points for delivery of one or more deposition precursors, background gases, energy transfer gases etc. to the plasma region or the ambient of the apparatus. In one embodiment, the substrate serves as the anode. In another embodiment, the substrate is in electrical communication or physical contact with the anode. A deposition precursor is injected into the deposition apparatus and transformed into a plasma upon application of an electric field between the anode and cathode. The plasma is then manipulated with a magnetic field to form a deposition medium enriched in neutral species and depleted in charged particles (ions or electrons). In one embodiment, the charged particle-depleted deposition medium is formed directly adjacent to the substrate and in another embodiment, the charged particle-depleted deposition medium is formed remote from the substrate and is directed to the substrate. A thin film material is then deposited on the substrate. The apparatus may include one or more additional deposition chambers for deposition of additional layers or materials simultaneously, if desired. In one embodiment, the deposition apparatus permits formation of thin film materials on a continuous web substrate.

In one embodiment, magnetic manipulation of the plasma includes restricting the spatial dimensions of the plasma. Restriction of spatial dimensions may include confining the plasma to a particular spatial region or controlling the shape of the plasma region. In one embodiment, a magnetic field is used to compress the plasma at one or more positions so that the average separation between the constituents of the plasma is decreased. The reduced separation promotes extinguishment or depletion of charged or ionized species and facilitates enrichment of the plasma with neutral or excited state neutral species to form a deposition medium.

The magnetic field may be permanent or variable (in time or space). In one embodiment, the strength of the magnetic field is spatially non-uniform. The magnetic field strength may progressively increase within a deposition apparatus in the direction of the substrate or within a plasma source chamber in the direction of the ejection point of the neutral-enriched or charged particle-depleted deposition medium.

DETAILED DESCRIPTION OF THE ILLUSTRATED EMBODIMENTS

Although this invention will be described in terms of certain preferred embodiments, other embodiments that are apparent to those of ordinary skill in the art, including embodiments that do not provide all of the benefits and features set forth herein and including embodiments that provide positive benefits for high-volume manufacturing, are also within the scope of this invention. Accordingly, the scope of the invention is defined only by reference to the appended claims.

The instant invention focuses on a plasma deposition process in which the state of the plasma is engineered to optimize the structural and electronic quality of an as-deposited thin film material. In one embodiment, the thin film material is a photovoltaic material. The invention is designed to remedy conditions present in plasmas used in conventional plasma deposition processes that impair the performance of an as-deposited photovoltaic material.

In a plasma deposition process, a plasma is normally formed by first delivering one or more precursors to a plasma initiation region of a deposition chamber. The precursors may be delivered separately or as an admixed stream. A carrier or background gas may also be present. The plasma initiation region is located between a cathode and an anode and a plasma is formed by applying a high strength electric field between an anode and a cathode. The region over which the plasma extends may be referred to as a plasma region. The plasma may be maintained with a DC or AC electric field. An AC electric field may be applied at a microwave frequency (e.g. 2.45 GHz), radiofrequency (e.g. 13.58 MHz), UHF frequency or VHF frequency.

The plasma formed in a conventional process includes a random and chaotic distribution of species in a steady state, dynamic equilibrium condition. The species may include molecules of the source material (e.g. precursor or carrier gas) as well as a distribution of metastable intermediate species. The metastable species include ions, ion-radicals and neutral radicals derived from the elements and fragments of the precursor or carrier gas molecules. The metastable species may be present in a ground state, one or more excited states, or a combination thereof.

Figure 1:
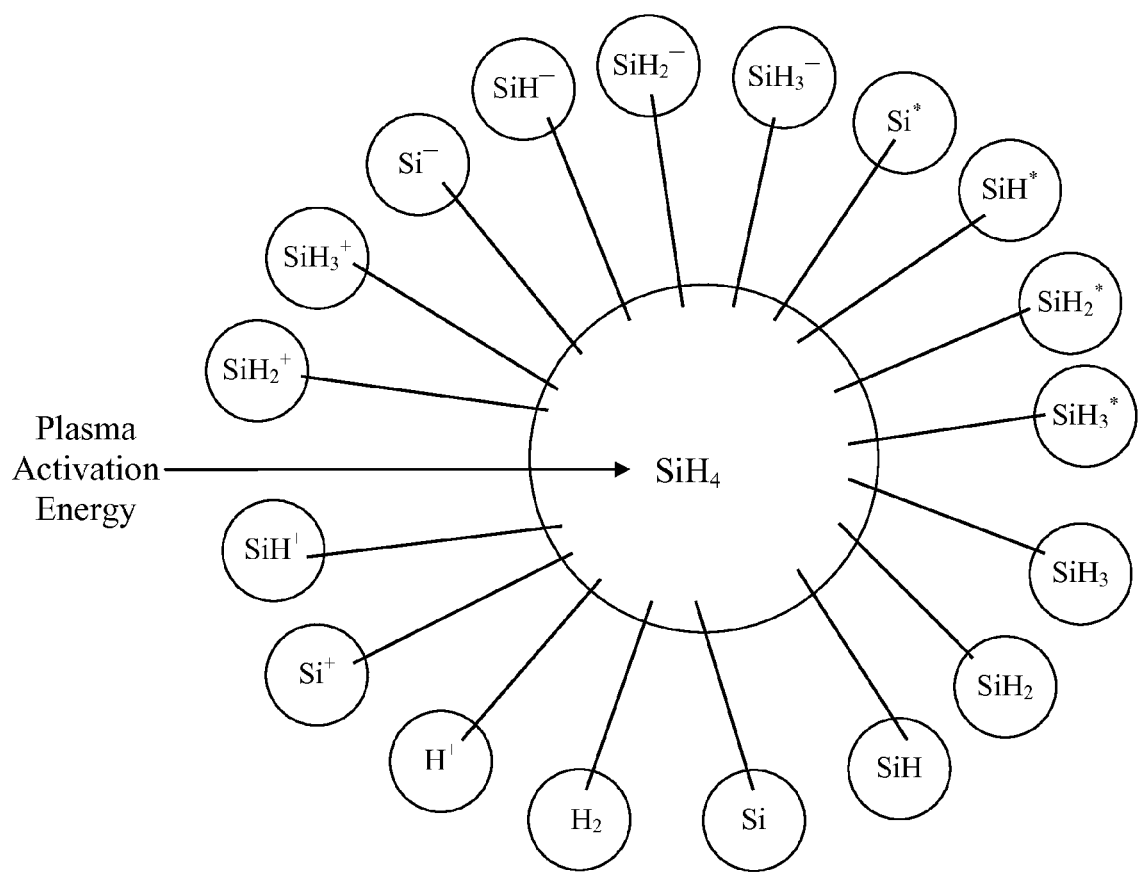
FIG. 1 depicts selected ionized and neutral species that may be formed from silane in a plasma deposition process.

By way of example, the plasma deposition of amorphous silicon occurs by delivering the molecular precursor silane ($SiH_4$) to a plasma chamber. FIG. 1 depicts potential metastable species that may be present when silane is activated to form a plasma. The metastable intermediates present in a silane plasma include a variety of ions, radicals and molecular species. The radicals may be neutral or charged. Neutral radicals include $SiH_3$, $SiH_2$, $SiH$, $Si$, and $H$. The species may be in a ground electronic state or an excited electronic state (designated by an asterisk (e.g. $SiH^*$ is a neutral radical in an excited electronic state)). The number density and excitation energy for formation of selected species in a conventional silane plasma are listed below.

| Species | Type | Energy (eV) | Number Density (cm$^{-3}$) |
|---|---|---|---|
| $SiH_x^+$ | ground state ion or ion-radical | >13.6 | ~$10^8$ |
| $Si^*$ | excited state neutral radical | 10.53 | ~$10^5$ |
| $Si$ | ground state neutral radical | 10.36 | ~$10^8$-$10^9$ |
| $SiH^*$ | excited state neutral radical | 10.33 | ~$10^5$ |
| $SiH_x^-$ | ground state ion or ion-radical | ~10 | ~$10^8$ |
| $SiH$ | ground state neutral radical | 9.47 | ~$10^8$-$10^9$ |
| $SiH_2$ | ground state neutral radical | 9.47 | ~$10^9$ |
| $SiH_3$ | ground state neutral radical | 8.75 | ~$10^{12}$ |
| $SiH_4$ | molecule | 0 | ~$10^{15}$ |

One of the limitations of conventional plasma deposition processes is an inability to adequately control the identity and abundance of the different species in the plasma. The need to control the characteristics of the plasma arises because some of the species present in the plasma are essential or beneficial to the deposition of the intended thin film material, while other species are detrimental. The origin of the detrimental effect of particular species on film properties may be chemical or physical in nature. In the case of silicon deposition from silane, for example, the neutral radical $SiH_2$ is thought to be detrimental because its incorporation into the as-deposited material creates dihydride defects that compromise solar efficiency through nonradiative processes. The dihydride defects are a consequence of the chemical stability and chemical configuration of the neutral $SiH_2$ radical.

Detrimental chemical interactions that alter the distribution of species may also occur within the plasma. In the deposition of amorphous silicon, for example, the neutral radical $SiH_3$ is believed to be the most favorable deposition species. Chemical interactions that cause $SiH_3$ to transform to other species before deposition are therefore undesired. Examples of such detrimental chemical interactions include hydrogen abstraction reactions that occur between high energy hydrogen-depleted plasma species (e.g. Si or SiH in a neutral or ionized state) and $SiH_3$. Hydrogen abstraction reactions are particularly detrimental because they deplete the concentration of the preferred $SiH_3$ deposition species and transform it to the deleterious $SiH_2$ species.

Physical interactions between plasma species and a depositing thin film may also impair the performance or properties of the thin film. The most problematic physical interactions are collisions that occur between plasma species and the thin film during film growth. Collisions lead to damage (e.g. bond breakage, ejection of atoms) and the formation of structural and electronic defects (e.g. dangling bonds, irregular coordination or configuration) in the as-deposited thin film material. As indicated hereinabove, the presence of defects diminishes photovoltaic efficiency by providing non-radiative decay channels that serve to deplete the concentration of photogenerated charge carriers.

Ionized plasma species are particularly likely to collide with the as-deposited thin film because of coulombic interactions that arise due to the presence of charged electrodes in the deposition system needed to initiate the plasma. Since the substrate (and as-deposited thin film) is normally in electrical communication with one of the electrodes (usually the anode), it accumulates charge that acts to attract oppositely charged species from the plasma. Strong coulombic interactions impart high kinetic energy to the attracted ionized plasma species and lead to particularly energetic collisions of the ionized plasma species with the as-deposited thin film.

To avoid detrimental chemical and physical interactions between species in the plasma phase or between plasma species and the as-deposited thin film, it is desirable to achieve control over the composition and distribution of species in the plasma. While some degree of control is available in the prior art through variations in process parameters such as temperature, pressure, concentration of precursors, type of precursors, flow rate, and electron temperature of the plasma, greater control is needed to improve the photovoltaic efficiency of thin film materials (especially at high deposition rates). Current methods of forming a plasma provide only coarse control over the state of the plasma and tend to emphasize iterative, empirical approaches that seek to optimize plasma conditions for a particular deposition.

Ideally, it would be desirable to restrict the species present in the plasma to only those species that are conducive to formation of high quality thin film materials, while rejecting deleterious species. Previously, the instant inventor has proposed various ways of achieving this objective. In a series of pending patent applications (U.S. patent application Ser. Nos. 12/199,656; 12/199,712; 12/199,730; and 12/199,745), the instant inventor described various processes and apparatuses for separating a conventional plasma into preferred species and detrimental species and delivering the preferred species to a substrate for deposition. The separation was effected by a biased mesh that selectively rejected ionized species, while transmitting preferred neutral species.

In a further pending patent application (U.S. patent application Ser. No. 12/209,699), the instant inventor described a method and apparatus for pre-selecting preferred metastable or intermediate species before deposition and delivering those species in a relatively pure form to the deposition process to achieve as-deposited thin film materials with low defect concentration at high deposition rates.

In still another pending patent application (U.S. patent application Ser. No. 12/316,417), S. R. Ovshinsky presented a general concept utilizing spatial coordination and time synchronization to control the distribution of species present in a plasma. Through control over the spatial point of injection and time of injection of one or more precursors to a plasma region (thus permitting a controlled evolution of the state of the plasma in space and time), S. R. Ovshinsky demonstrated unprecedented control over the distribution of species present in a plasma and produced a plasma having a particularly favorable distribution of metastable species for deposition of photovoltaic materials based on amorphous silicon and related materials.

In the instant invention, control over the distribution of species in a plasma is achieved through interactions of the plasma with a magnetic field. A magnetic field is used to reduce the concentration of ionized species in a plasma to achieve a higher fraction of neutral species. A conventional plasma is manipulated with a magnetic field to promote or preserve the presence of neutral species (in a ground or excited state) relative to charged or ionized species. The manipulated plasma is enriched in neutral species and may be referred to herein as a neutral-enriched deposition medium. The manipulated plasma is also depleted in charged particles (ions or electrons) and may also be referred to herein as a charged particle-depleted deposition medium. By depositing a thin film material with the instant neutral-enriched or charged particle-depleted deposition medium, a reduction in defects is observed and better thin film properties result. In one embodiment, the thin film material deposited from the instant neutral-enriched or charged particle-depleted deposition medium is a photovoltaic material.

A magnetic field may be used to influence the interactions that occur between species in a plasma and the spatial boundaries of the plasma. By compressing the spatial extent of a plasma region, a magnetic field reduces the average spacing between the constituent ions, radicals, and molecules that comprise the plasma. The reduced spatial separation reduces the mean free path of the constituent species of a plasma and increases the likelihood of interactions between species. The instant invention recognizes that a magnetic field exerts a greater influence on ionized or charged species in a plasma than on neutral or uncharged species in a plasma. As a result, the overall state of charge (measured, for example, as the fraction of species in a charged state) of a plasma can be influenced with a magnetic field.

In one aspect of the instant invention, a magnetic field is applied to confine the volume of a plasma, where interactions between ionized species in the confined volume are enhanced. Since the strongest interactions in a plasma are between oppositely charged species, the enhanced interactions that occur upon confinement of the volume of the plasma leads to a preferential extinguishment or depletion of ionized or charged species through collisions that have the net effect of transforming charged or ionized species to neutral species. In addition to compression or volume confinement, manipulations of a plasma in accordance with the instant invention include shaping, redirection, reflection, pinching, cusping, and modification of the speed of flow.

A magnetic field used to manipulate a plasma in accordance with the instant invention may be persistent in time or intermittent (e.g. pulsed or oscillating). The orientation of the magnetic field may be at any angle relative to the plasma region. The plasma region generally extends between a cathode and an anode, where the direction connecting the centers of the two electrodes may be referred to herein as an axial direction. A magnetic field applied in an axial direction may be referred to herein as an axial magnetic field. The magnetic field may also be applied in a direction transverse to an axial direction or at an arbitrary angle relative to an axial direction.

While not wishing to be bound by theory, the instant inventors propose that confinement and enrichment of a plasma to form a neutral-enriched deposition medium may be aided by a magnetism-induced circulation or swirl of species in the plasma in one embodiment. It is known that magnetic fields can induce motion of charged particles and that the net axial or longitudinal motion of positive and negative particles can be aligned in the same direction. An electron in a static and uniform magnetic field, for example, moves with a circular motion due to the Lorentz force. The circular motion may be superimposed with a uniform axial motion or with a uniform motion perpendicular to the field. In one embodiment of the instant invention, a magnetic field is applied to induce circular or helical motion of species in a plasma. Such motion may be referred to herein as a swirl, swirling motion, swirling flow or the like, or a transverse motion, and may, in one embodiment, be induced by applying a magnetic field in an axial direction. The swirling or transverse motion of oppositely charged particles occurs in opposing directions (e.g. clockwise vs. counterclockwise transverse circular or helical motion), while the axial or longitudinal motion of oppositely charged particles occurs in the same direction.

It is believed that the swirling motion may be accompanied by a segregation of charged and uncharged (neutral) species in the plasma. Depending on the direction and distribution of magnetic field strength, segregation may occur in an axial and/or radial direction relative to the direction defining the separation between electrodes. As charged species become segregated, the average distance between charged species decreases and interactions between charged species become more frequent. As a result, conversion of charged species to neutral species is promoted and the plasma progresses toward a neutral-enriched or charge-depleted state. Although segregation may also have the tendency to concentrate neutral species, it is believed that the collision energy of neutral species with each other is too low to effect an appreciable conversion of neutral species to charged species. The swirling motion may also be accompanied by confinement or reduction in the volume of the plasma.

In one embodiment, the segregation of ionized or charged species relative to neutral species induced by motion of species within the plasma results in the formation of regions within the plasma that are enriched with ionized or charged species that are spatially removed from regions within the plasma that are enriched with neutral species. In one embodiment, the plasma is moving in a longitudinal direction (e.g. an axial direction extending from one electrode used in forming the plasma to the other electrode used in forming the plasma) and a magnetic field induces a transverse circular or helical flow, where in the transverse flow, charged particles are segregated away from the outer boundaries of the plasma toward the interior of the plasma. In this embodiment, neutral species are affected only secondarily by the magnetic field (e.g. by flow) and a net enrichment of neutral species towards the outer boundary of the plasma results. It is generally expected that the segregation of species will be partial and not complete, so that some degree of intermixing of ionized and neutral species remains.

The magnetic field strength contemplated for the instant invention is on the order of a few hundred to a few thousand Gauss. As is known in the art, the magnitude of the effect of a magnetic field on charged particles depends on the mass of the charged particles. Motion of lighter particles can be induced with weaker magnetic fields, while stronger magnetic fields are needed to induce motion of heavier particles. Charged species in a plasma include electrons, which are the lightest species and susceptible to influence by relatively weak magnetic fields. Positive and negative ions comprised of atoms are more massive than electrons and require stronger magnetic fields.

In one embodiment, the magnetic field strength used to manipulate a plasma to form a charged particle-depleted deposition medium is greater than 250 Gauss. In a second embodiment, the magnetic field strength used to manipulate a plasma to form a charged particle-depleted deposition medium is greater than 500 Gauss. In a third embodiment, the magnetic field strength used to manipulate a plasma to form a charged particle-depleted deposition medium is greater than 750 Gauss. In a fourth embodiment, the magnetic field strength used to manipulate a plasma to form a charged particle-depleted deposition medium is greater than 1000 Gauss. In a fifth embodiment, the magnetic field strength used to manipulate a plasma to form a charged particle-depleted deposition medium is greater than 2000 Gauss. In a sixth embodiment, the magnetic field strength used to manipulate a plasma to form a charged particle-depleted deposition medium is greater than 3000 Gauss. Magnetic fields in accordance with the instant invention may be created by a magnetized material, a solenoid, or current loop.

As indicated hereinabove, the plasma may be established at an alternating frequency, such as a radiofrequency or microwave frequency. In one embodiment, the magnetic field strength induces circular or helical motion in one or more charged species in a plasma having a frequency comparable to the frequency of the plasma. An axial magnetic field having a strength of about 875 Gauss, for example, induces an ECR (electron cyclotron resonance) condition in electrons in a plasma having a frequency in the microwave range (2.45 GHz). At the ECR condition, the frequency of the gyrational or cyclotron motion of electrons is in resonance with the frequency of the plasma and at this condition, the coupling of energy from the plasma into the electrons is particular efficient and the electron temperature can conveniently controlled. For ionic species, a similar ICR (ion cyclotron resonance) condition can be achieved at higher magnetic field strengths dictated by ion mass.

Figure 2:
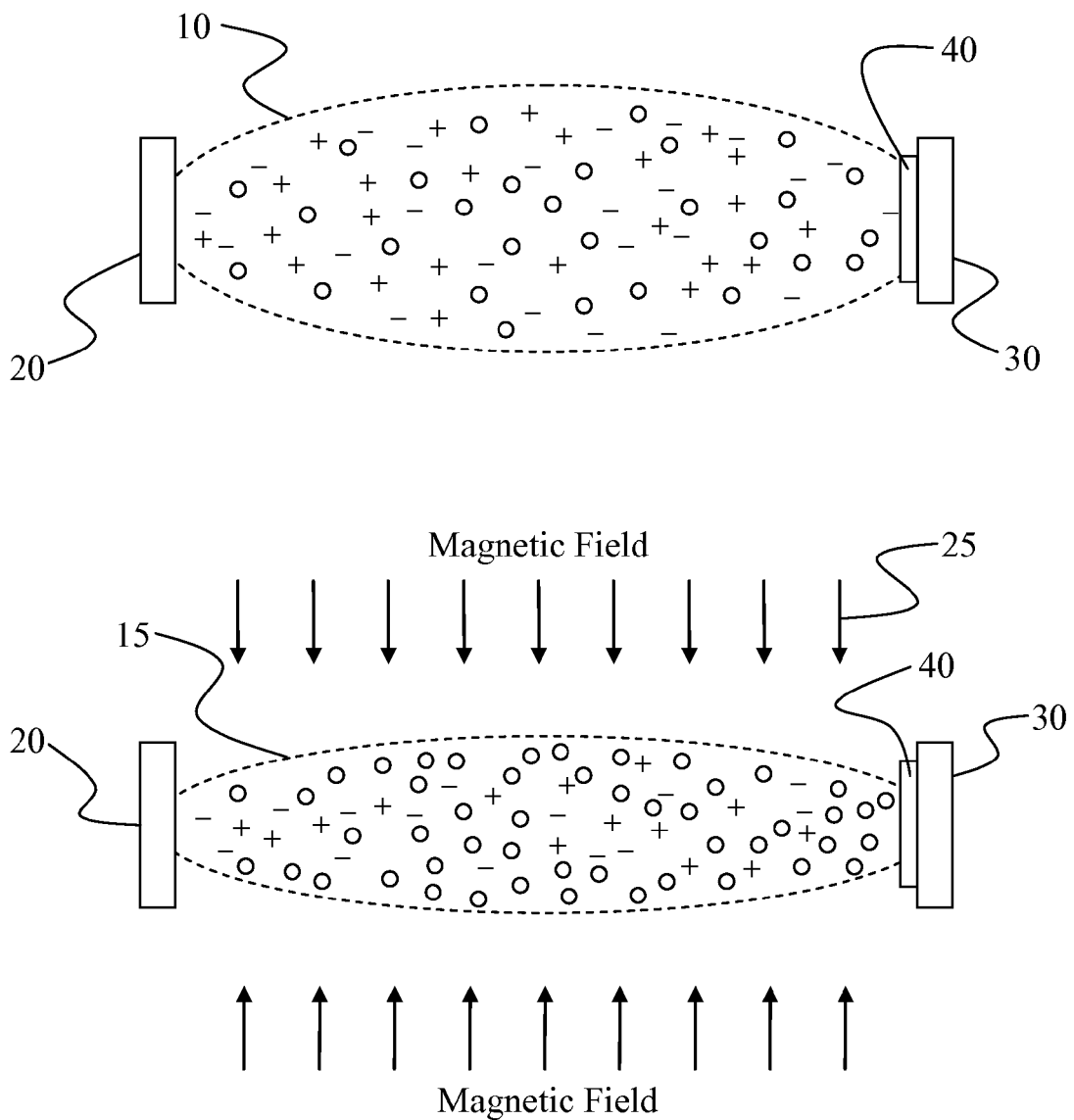
FIG. 2 is a schematic depiction of the effect of a magnetic on a plasma.

FIG. 2 illustrates the effect of a magnetic field on the distribution of species in a plasma formed from a precursor gas. The upper portion of FIG. 2 shows a schematic depiction of a plasma in the absence of a magnetic field. Plasma 10 is formed by applying an electric field to a precursor gas injected between electrode 20 and electrode 30. The point of injection of the precursor gas and outer boundaries of the deposition chamber are not shown. Since the precursor gas is injected with an input velocity, the plasma that is formed is in motion. For purposes of this discussion, we assume that plasma 10 has a net axial motion in the direction from electrode 20 to electrode 30 (i.e. motion from left-to-right) in FIGS. 2-4. Plasma 10 includes charged species (depicted with the symbols "+" and "−" to signify positively and negatively charged species, respectively, which may include electrons and ions) and neutral species (depicted with symbols "o"). The specific species present depend on the precursor. In the case of silane, the most common positive, negative, and neutral species are listed in FIG. 1.

The lower portion of FIG. 2 shows the confinement effect 25 of a magnetic field on the plasma. Plasma 10 has been compressed (confined) by confinement magnetic field 25 to form charged particle-depleted plasma 15 between electrode 20 and electrode 30. Charged particle-depleted plasma 15 includes charged species (electrons and ions) and neutral species, where magnetic field 25 has produced an enhancement of the concentration of neutral species and a depletion of the concentration of charged species relative to unconfined plasma 10. As noted above, unconfined plasma 10 includes experiences a net axial motion from electrode 20 to electrode 30. Charged particle-depleted plasma 15 also includes a net axial motion from electrode 20 to electrode 30. Due to the presence of a magnetic field, however, charged particle-depleted plasma 15 also includes a transverse circular or helical motion and likely also includes a net segregation of the remaining charged species toward the interior portion of the plasma volume. A charged particle-depleted plasma may also be referred to herein as a charged particle-depleted deposition medium, a neutral-enriched deposition medium, or a neutral-enriched plasma.

By varying the strength of magnetic field 25, one can control the degree of depletion or extinguishment of charged species and the ratio of neutral species to charged species. In one embodiment, the ratio of neutral species to charged species in the presence of magnetic field 25 is a factor of 10 or greater than the ratio of neutral species to charged species in the absence of magnetic field 25 (at common plasma initiation conditions). In another embodiment, the ratio of neutral species to charged species in the presence of magnetic field 25 is a factor of 100 or greater than the ratio of neutral species to charged species in the absence of magnetic field 25 (at common plasma initiation conditions). In a further embodiment, the ratio of neutral species to charged species in the presence of magnetic field 25 is a factor of 1000 or greater than the ratio of neutral species to charged species in the absence of magnetic field 25 (at common plasma initiation conditions).

The ratio of neutral species to charged species may also be expressed in absolute terms. In one embodiment, the ratio of neutral species to charged species in a magnetically-manipulated plasma is $10^4$:1 or higher. In another embodiment, the ratio of neutral species to charged species in a magnetically-manipulated plasma is $10^5$:1 or higher. In a further embodiment, the ratio of neutral species to charged species in a magnetically-manipulated plasma is $10^6$:1 or higher.

FIG. 2 also shows substrate 40 onto which a thin film material is deposited from plasma 10 or charged particle-depleted plasma 15. As is evident from FIG. 2, the distribution of species adjacent to substrate 40 (or an evolving thin film material deposited on substrate 40) differs in plasma 10 and charged particle-depleted plasma 15. Specifically, plasma 10 includes a greater proportion of charged species near the thin film material being deposited on substrate 40 than does charged particle-depleted plasma 15. As a result, a thin film material deposited in the absence of magnetic field 25 is influenced to a greater extent by charged species than is a thin film material deposited in the presence of magnetic field 25. As noted above, charged species lead to more energetic collisions with an evolving thin film material than do neutral species and have a much greater tendency to damage the material through bond scission, formation of dangling bonds, or ejection of matter from the thin film material. Interactions of charged species with the evolving thin film material also lead to a higher concentration of electronic defects.

A thin film material formed from a charged particle-depleted deposition medium (such as charged particle-depleted plasma 15) experiences fewer interactions with charged species and is damaged to a lesser extent. As a result, a thin film material produced from a charged particle-depleted deposition medium contains fewer defects, has fewer dangling bonds, and possesses a more regular bonding configuration. In the embodiment of thin film photovoltaic materials formed from a charged particle-depleted deposition medium, higher photovoltaic efficiency is expected.

Magnetic field 25 depicted in FIG. 2 is an embodiment in which the magnetic field strength is uniform. A uniform magnetic field is one in which the applied magnetic field strength is constant. As indicated hereinabove, the strength of a uniform magnetic field can be used to control the volume occupied by a plasma and the relative proportions of neutral and ionized (charged) species. In other embodiments, a non-uniform magnetic field may be applied to influence the shape of a plasma region. A non-uniform magnetic field is one in which the magnetic field strength is non-constant and varies in at least one spatial direction. While uniform magnetic fields may generally be expected to induce symmetric changes in the shape of a plasma region, non-uniform magnetic fields may be used to induce asymmetric changes in the shape of a plasma region. Depending on the orientation and nature of a non-uniform magnetic field, asymmetry may be induced in an axial direction, transverse direction, or arbitrary direction.

Figure 3:
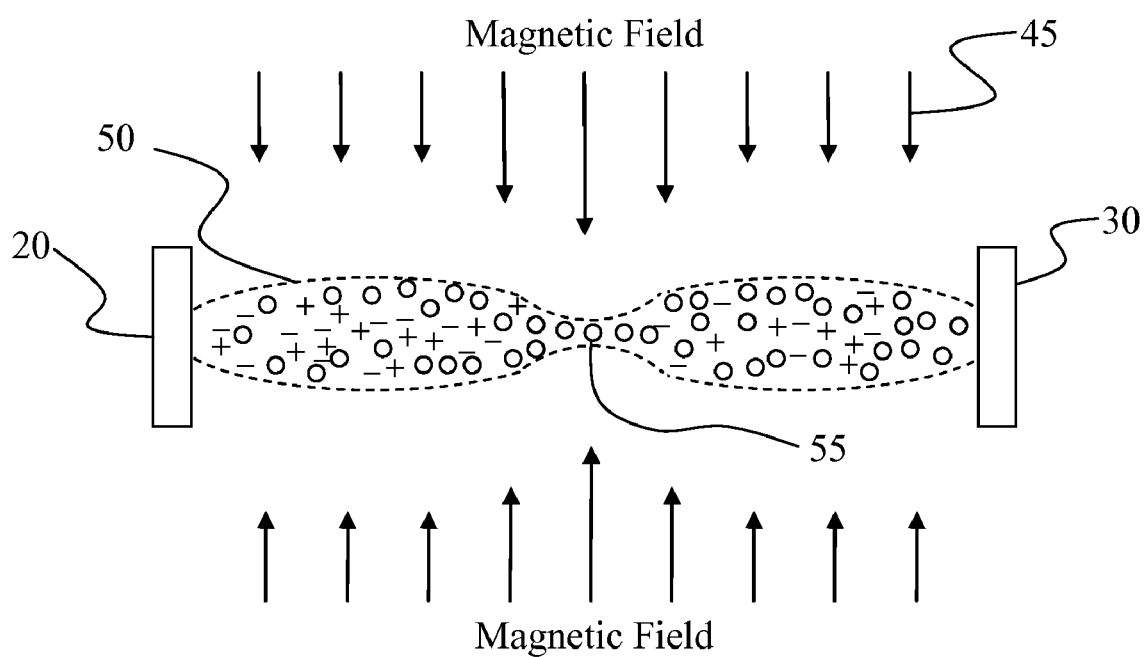
FIG. 3 is a schematic depiction of the effect of a non-uniform magnetic field on a plasma.

FIG. 3 depicts one embodiment of the effect of a non-uniform magnetic field on a plasma region. Plasma 50 is located between electrode 20 and electrode 30 and is shaped by non-uniform magnetic field 45. The confinement force of non-uniform magnetic field 45 is greatest in the central portion of the space between electrode 20 and electrode 30 and diminishes in the direction toward either electrode. The effect of non-uniform magnetic field 45 on plasma 50 varies with magnetic field strength. Confinement of plasma 50 is greater in regions experiencing a stronger magnetic field than in regions experiencing a weaker magnetic field. Since the strength of non-uniform magnetic field 45 is greatest in the central region, plasma 50 is most confined in that region. Pinchpoint 55 represents the most confined portion of plasma 50 and corresponds to the portion expected to have the greatest annihilation of charged species. After annihilation, the plasma passes through pinchpoint 55 and continues in the direction of electrode 30. The portion of the plasma downstream from pinchpoint 55 is charged particle-depleted and provides a more favorable deposition medium for forming thin film materials. As discussed in connection with FIG. 2, in addition to an axial motion in the direction from electrode 20 to electrode 30, plasma 50 includes a transverse circular or helical motion to the flow.

Figure 4:
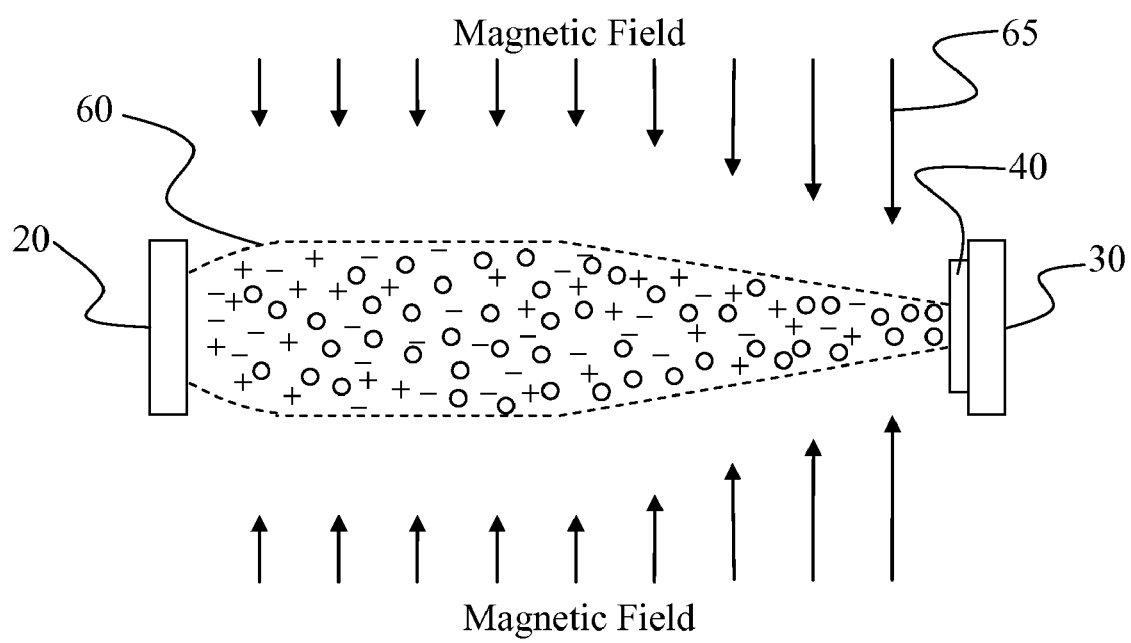
FIG. 4 is a schematic depiction of the effect of a non-uniform magnetic field on a plasma.

FIG. 4 depicts an alternative illustrative embodiment of a non-uniform magnetic field. In FIG. 4, the strength or confinement effect of magnetic field 65 progressively increases as substrate 40 is approached. As a result of magnetic field 65, the shape of plasma 60 formed between electrode 20 and electrode 30 tapers in the vicinity of substrate 40. As plasma 60 tapers, it becomes more confined, interactions between species occur with greater frequency, and a progression toward an increasingly more neutral-enriched or charged particle-depleted deposition medium occurs. The region of plasma 60 adjacent to substrate 40 is most depleted of charged particles and provides a favorable deposition medium for the formation of high quality thin film materials.

In some embodiments, the electrodes, plasma region, substrate and manipulation of the plasma with a magnetic field occur in a common deposition apparatus or chamber. In one configuration, the charged particle-depleted deposition medium obtained through magnetic manipulation of a plasma is positioned in a region between a cathode and an anode, where the anode functions as a substrate or the substrate is in electrical communication with the anode. The embodiments shown in FIGS. 2-4, for example, may be enclosed in a chamber to perform deposition of a thin film material from a charged particle-depleted deposition medium. The chamber may be equipped with delivery lines to provide one or more precursors. One or more inert or background gases (e.g. Ar, $N_2$, $H_2$, He, Xe, or Kr) may also be provided to or resident in the chamber. The chamber may include internal magnets to provide a magnetic field or the magnetic field may be formed external to the chamber and extend into the chamber to manipulate the plasma in accordance with the instant invention.

In other embodiments, a plasma is formed remote from the substrate and manipulated with a magnetic field away from the substrate to form a charged particle-depleted deposition medium that is subsequently directed to the substrate. Such embodiments may be referred to herein as remote source embodiments. In a remote source embodiment, a plasma is formed in a separate chamber or region within a deposition apparatus separated from the substrate. Magnetic manipulation of the plasma occurs away from the substrate and the resulting charged particle-depleted or neutral-enriched deposition medium is transported to the substrate via a delivery device (such as a nozzle or aperture). The separate chamber or region in which the charged particle-depleted or neutral-enriched deposition medium is produced may be referred to herein as a remote source. The remote source is typically integrated with or in material communication with a substrate positioned in a separate chamber or region of a deposition apparatus.

Figure 5:
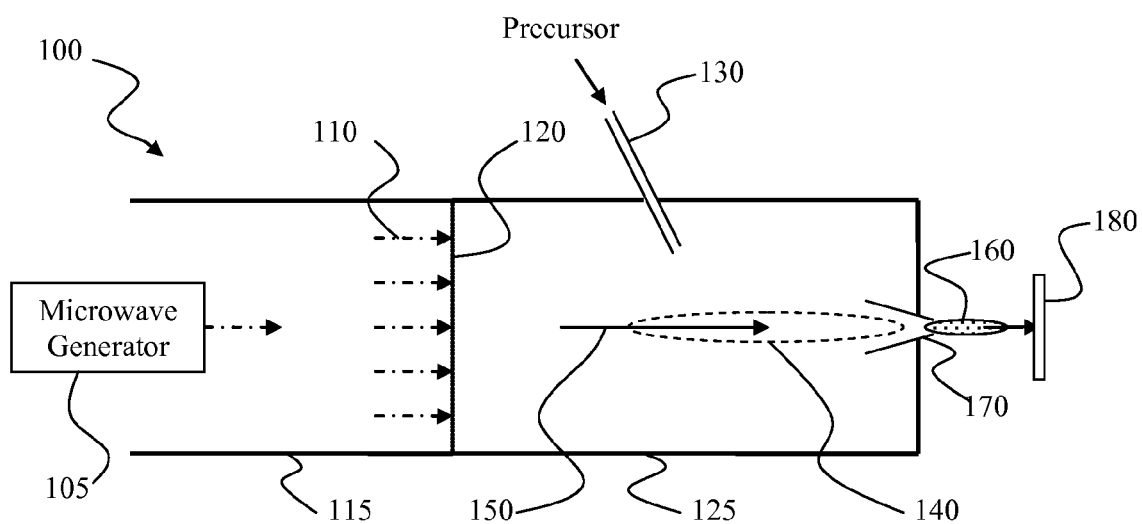
FIG. 5 is a schematic depiction of a remote source that produces a neutral-enriched deposition medium from a microwave plasma.

FIG. 5 shows an illustrative embodiment of a remote source that produces a charged particle-depleted deposition medium from a microwave plasma. Remote source 100 includes microwave generator 105 that produces microwaves 110 that travel along waveguide 115 through microwave window 120. Microwaves 110 enter plasma chamber 125. A precursor is introduced through inlet 130 into plasma chamber 125 and plasma 140 is formed. Plasma chamber 125 may also include a background gas which may participate in the initiation of the plasma and which may contribute species to the plasma. Plasma chamber 125 may also include a plurality of inlets to deliver multiple precursors. Different precursors may also be mixed in a common inlet stream of gas or vapor. In the embodiment shown in FIG. 5, an axial magnetic field 150 is applied across plasma 140. The strength of axial magnetic field 150 increases with increasing distance from microwave window 120.

Magnetic field 150 influences plasma 140 as described hereinabove to form deposition medium 160 that exits nozzle 170 and impinges substrate 180 to form a thin film material. Since the magnetic field strength experienced by plasma 140 increases as nozzle 170 is approached, the relative proportion of neutral species increases and the relative proportion of charged particles decreases in the vicinity of nozzle 170. Deposition medium 160 is accordingly enriched in neutral species, depleted in charged species, and serves as a source for producing high quality thin film materials. As indicated hereinabove, the axial magnetic field in the embodiment of FIG. 5 may be configured to induce a helical or swirling trajectory for species in the plasma. By imposing an axial magnetic field whose strength increases in the direction toward nozzle 170, the radial extent of the helical or swirling trajectory may be compressed as nozzle 170 is approached and the degree of neutral enrichment or charged particle annihilation of deposition medium 160 may be enhanced accordingly.

In one embodiment, the nozzle may be essentially a magnetic mirror, a short solenoid or current loop near the output port that has a co-axial magnetic field larger than that of the solenoid. Such a short solenoid or current loop acts essentially as a nozzle because charged particles moving within a given angle (the arcsin of the square root of the ratio of the solenoid magnetic field and loop magnetic field) of its central axis pass through it. The magnetic mirror in effect pinches the field lines of the magnetic field.

In one embodiment, a plasma is initiated in the presence of an existing magnetic field and is manipulated to form a neutral-enriched or charged particle-depleted deposition medium upon activation. In another embodiment, a plasma is initiated and after activation is subjected to a magnetic field and manipulated to form a neutral-enriched or charged particle-depleted deposition medium.

The principles of the instant invention extend generally to gas phase precursors, vaporized liquid precursors, and sublimed solid phase precursors. A precursor in gas or vapor phase form is delivered to a plasma activation region and the resulting plasma is manipulated with a magnetic field as described hereinabove to form a neutral-enriched or charged particle-depleted deposition medium. Illustrative precursors include hydrides, organometallic compounds, or compounds of semiconducting elements with organic ligands. Organometallic compounds and compounds with organic ligands include alkyl, aryl, alkenyl, alkynyl, nitro, amino, amido, and related compounds. Precursors in gas or vapor phase form may be delivered separately or as a mixed stream and may optionally be introduced along with a carrier gas to the plasma region.

In one embodiment, the precursor is a source material for a photovoltaic thin film material. Photovoltaic source materials include molecular deposition precursors such as silane ($SiH_4$), disilane ($Si_2H_6$), and germane ($GeH_4$). Photovoltaic source materials also include fluorinated silicon and germanium compounds such as $SiF_4$, $GeF_4$, fluorinated forms of silane ($SiF_3H$, $SiF_2H_2$, $SiFH_3$), and fluorinated forms of germane ($GeF_3H$, $GeF_2H_2$, $GeFH_3$). The advantages of fluorine in the deposition of photovoltaic materials have been well documented by S. R. Ovshinsky. In particular, S. R. Ovshinsky has shown that the inclusion of fluorine promotes the regular coordination of silicon, germanium and other constituents of thin film materials, acts to passivate dangling bonds and other defects, and in appropriate quantities, acts to promote the formation of nanocrystalline, intermediate range order, or microcrystalline phases of silicon and germanium. Fluorine may be included as or within a ligand of a precursor compound and delivered to the plasma activation region. Alternatively, a fluorine source such as $F_2$ or HF may be delivered along with one or more other sources to participate in the generation of a neutral-enriched deposition medium. (For more information see U.S. Pat. Nos. 5,103,284 (formation of nanocrystalline silicon from $SiH_4$ and $SiF_4$); 4,605,941 (showing substantial reduction in defect states in amorphous silicon prepared in presence of fluorine); and 4,839,312 (presents several fluorine-based precursors for the deposition of amorphous and nanocrystalline silicon)).

Source materials in accordance with the instant invention also include precursors that deliver dopants to the thin film material. Dopant sources provide elements to the thin film that impart n-type or p-type conductivity. Representative dopant sources include $NH_3$, $N_2$, $AsH_3$, $PH_3$, $PH_5$, $SF_6$, $BF_3$, $B_2H_6$, $BH_3$, and combinations thereof.

Carrier gases may also be included in the instant deposition process. Carrier gases are gases that do not contribute an element to the thin film composition being deposited and are generally used to dilute precursors or other source materials. Carrier gases may also be activated during the plasma initiation process and may contribute species to the plasma. Representative carrier gases in accordance with the instant invention include neon (Ne), helium (He), argon (Ar), krypton (Kr), xenon (Xe), or combinations thereof. For some thin film compositions, hydrogen ($H_2$) or nitrogen ($N_2$) may also function as carrier gases. In a preferred embodiment, the carrier gas is chemically inert with respect to the precursors or other source materials employed in the deposition.

The instant invention generally provides a method and apparatus for manipulating a plasma to form a neutral-enriched or charged particle-depleted deposition medium that is subsequently used to form a thin film material. Manipulation of the plasma with a magnetic field leads to an increase in the concentration (e.g. number density) of at least one neutral species relative to the state of the plasma in the absence of the magnetic field under otherwise identical or substantially identical conditions. In one embodiment, a silicon-containing precursor is used and the magnetic field increases the concentration of the neutral $SiH_3$ species. The neutral $SiH_3$ species may be in a ground or excited electronic state. In another embodiment, a germanium-containing precursor is used and the magnetic field increases the concentration of the neutral $GeH_3$ species. The neutral $GeH_3$ species may be in a ground or excited electronic state. In still another embodiment, a fluorinated silicon-containing precursor is used and the magnetic field increases the concentration of the neutral $SiF_3$ species. The neutral $SiF_3$ species may be in a ground or excited electronic state. In a further embodiment, a fluorine-containing precursor is used and the magnetic field increases the concentration of the neutral F species. The neutral F species may be in a ground or excited electronic state.

Alternatively, manipulation of the plasma with a magnetic field leads to a decrease in the concentration (e.g. number density) of at least one charged species relative to the state of the plasma in the absence of the magnetic field under otherwise identical or substantially identical conditions. In one embodiment, a silicon-containing precursor is used and the magnetic field decreases the concentration of a charged $SiH_2$ species.

In embodiments in which two or more precursors (or a precursor and a dopant source, or a precursor and a carrier gas, etc.) are employed, the magnetic field leads to an increase in the concentration of at least one neutral species derived from at least one of the precursors or a decrease in the concentration of at least one charged species derived from at least one of the precursors.

The instant invention further extends to the deposition of multilayer device structures. A first thin film material may be formed in accordance with the instant invention and a second thin film material formed in accordance with the instant invention may subsequently be formed thereon. Multilayer devices include photovoltaic devices such as tandem cells or multiple (e.g. triple) junction cells having a plurality of layers that differ in composition and/or bandgap. Embodiments include multilayer devices having a silicon layer and a germanium layer, a silicon layer and a SiGe layer, a germanium layer and a SiGe layer, or two or more SiGe layers that differ in the proportions of Si and Ge.

In one embodiment, the thin film material is a silicon-based photovoltaic material having a non-single crystal microstructure and a midgap defect concentration of less than $1 \times 10^{16}$ cm$^{-3}$. More preferably, the non-single crystal material has a midgap defect concentration of less than $1 \times 10^{15}$ cm$^{-3}$. Most preferably, the non-single crystal material has a midgap defect concentration of less than $5 \times 10^{14}$ cm$^{-3}$. The non-single crystal material may be a nanocrystalline material or a microcrystalline material, and may be an intrinsic material or a material doped with a p-type or n-type element.

Those skilled in the art will appreciate that the methods and designs described above have additional applications and that the relevant applications are not limited to the illustrative examples described herein. The present invention may be embodied in other specific forms without departing from the essential characteristics or principles as described herein. The embodiments described above are to be considered in all respects as illustrative only and not restrictive in any manner upon the scope and practice of the invention. It is the following claims, including all equivalents, which define the true scope of the instant invention.

With regard to steps in methods of the instant invention, it is to be understood that the order of the different individual steps may be varied or reversed consistent with operability of the invention as described herein.

I claim:

1. A method of forming a thin film material comprising:
   providing one or more precursors;
   activating said precursor to form a plasma, said plasma comprising a plurality of species, said plurality including one or more charged species and one or more neutral species;
   manipulating said plasma with a magnetic field, said manipulation of said plasma decreasing the concentration of said charged species in said plasma to produce a charged particle-depleted deposition medium; and
   forming a thin film material from said charged particle-depleted deposition medium.

2. The method of claim 1, wherein said one or more precursors include a precursor comprising silicon or germanium.

3. The method of claim 2, wherein said one or more precursors comprises a precursor selected from the group consisting of $SiH_4$, $Si_2H_6$, alkyl-substituted silane, $GeH_4$, $Ge_2H_6$, alkyl-substituted germane, $SiF_4$, a fluorinated form of $SiH_4$, $GeF_4$ and a fluorinated form of $GeH_4$.

4. The method of claim 2, wherein said manipulating of said plasma with said magnetic field increases the concentration of neutral $SiH_3$ species.

5. The method of claim 2, wherein said one or more precursors include a precursor comprising silicon and a precursor comprising germanium.

6. The method of claim 5, wherein said one or more precursors include $SiH_4$ and $GeH_4$.

7. The method of claim 2, wherein the defect concentration of said thin film material is less than $1 \times 10^{16}$ cm$^{-3}$.

8. The method of claim 2, wherein the defect concentration of said thin film material is less than $1 \times 10^{15}$ cm$^{-3}$.

9. The method of claim 2, wherein said one or more precursors further include a precursor comprising a doping element.

10. The method of claim 9, wherein said doping precursor comprises boron or phosphorous.

11. The method of claim 1, wherein said one or more precursors include a precursor comprising fluorine or hydrogen.

12. The method of claim 11, wherein said manipulating of said plasma with said magnetic field increases the concentration of the neutral F species.

13. The method of claim 1, wherein said activating precursor comprises:
    providing a first electrode;
    providing a second electrode; said magnetic field being aligned with a direction extending from said first electrode to said second electrode; and
    providing an electric field between said first electrode and said second electrode, said electric field defining a plasma activation region, said plasma from said precursor forming in said plasma activation region.

14. The method of claim 13, wherein the strength of said magnetic field is uniform along said direction extending from said first electrode to said second electrode.

15. The method of claim 13, wherein the strength of said magnetic field monotonically increases over a first distance in said direction extending from said first electrode to said second electrode.

16. The method of claim 15, wherein the strength of said magnetic field monotonically decreases over a second distance in said direction extending from said first electrode to said second electrode.

17. The method of claim 13, wherein said formation of said thin film occurs outside of said plasma activation region.

18. The method of claim 1, wherein said manipulating of said plasma with said magnetic field comprises reducing the volume of said plasma.

19. The method of claim 1, wherein said manipulating of said plasma with said magnetic field increases the concentration of said neutral species in said plasma.

20. The method of claim 1, wherein said manipulating of said plasma with said magnetic field induces a swirling motion of or within said plasma.

21. The method of claim 20, wherein said swirling motion comprises helical motion.

22. The method of claim 20, wherein said swirling motion forms regions enriched in said charged species and regions enriched in said neutral species within said plasma.

23. The method of claim 20, wherein said swirling motion decreases the average spatial separation between said charged species.

24. The method of claim 1, wherein said manipulating of said plasma with said magnetic field induces recombination of positively-charged species with negatively-charged species, said recombination contributing to said decrease in concentration of said charged species.

25. The method of claim 1, wherein said magnetic field varies in time.

26. The method of claim 1, wherein the strength of said magnetic field is at least 250 Gauss.

27. The method of claim 1, wherein the strength of said magnetic field is at least 500 Gauss.

28. The method of claim 1, wherein the strength of said magnetic field is at least 1000 Gauss.

29. The method of claim 1, wherein said plasma is established at a radiofrequency or microwave frequency.

30. The method of claim 29, wherein said magnetic field establishes an electron cyclotron condition within said plasma.

31. The method of claim 29, wherein said magnetic field establishes an ion cyclotron condition within said plasma for at least one of said ionized species.

32. The method of claim 1, wherein said activating occurs in a chamber equipped with an outlet, said plasma being formed in said chamber, said manipulating with said magnetic field to form said charged particle-depleted deposition medium occurring in said chamber, said charged particle-depleted deposition medium exiting said chamber through said outlet, said exiting charged particle-depleted deposition medium impinging on a substrate positioned outside of said chamber to form said thin film material.

33. The method of claim 32, wherein said outlet comprises a nozzle.

34. The method of claim 33, wherein a potential is applied to said nozzle, said potential aiding the activation of said precursor to form said plasma.

35. The method of claim 32, wherein said outlet is a magnetic mirror.

36. The method of claim 1, wherein said activation of said precursor occurs in the presence of said magnetic field.

37. The method of claim 1, wherein said thin film material is a photovoltaic material.

38. The method of claim 1, further comprising providing a second precursor, said second precursor being provided after formation of said thin film material.

39. The method of claim 38, further comprising forming a second thin film material from said second precursor, said second thin film material being formed on said thin film material.

40. The method of claim 1, further comprising separating said charged particle-depleted deposition medium from said plasma.

41. The method of claim 1, wherein the number density ratio of said neutral species to said charged species is greater than $10^4:1$.

42. The method of claim 1, wherein the number density ratio of said neutral species to said charged species is greater than $10^6:1$.

43. The method of claim 1, wherein said thin film material comprises an element derived from said neutral species.

* * * * *